(12) United States Patent
He et al.

(10) Patent No.: US 12,527,020 B2
(45) Date of Patent: Jan. 13, 2026

(54) NITRIDE-BASED SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Chuan He, Suzhou (CN); Xiaoqing Pu, Suzhou (CN); Ronghui Hao, Suzhou (CN); Jinhan Zhang, Suzhou (CN); King Yuen Wong, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 1135 days.

(21) Appl. No.: 17/601,712

(22) PCT Filed: Sep. 7, 2021

(86) PCT No.: PCT/CN2021/116883
§ 371 (c)(1),
(2) Date: Mar. 16, 2023

(87) PCT Pub. No.: WO2023/035102
PCT Pub. Date: Mar. 16, 2023

(65) Prior Publication Data
US 2024/0030330 A1 Jan. 25, 2024

(51) Int. Cl.
*H01L 29/778* (2006.01)
*H01L 29/06* (2006.01)
(Continued)

(52) U.S. Cl.
CPC ......... *H10D 30/475* (2025.01); *H10D 30/015* (2025.01); *H10D 62/102* (2025.01);
(Continued)

(58) Field of Classification Search
CPC .............. H10D 30/475; H10D 30/015; H10D 62/8503; H10D 62/102; H10D 62/343; H10D 62/117; H10D 64/411
See application file for complete search history.

(56) References Cited

U.S. PATENT DOCUMENTS 10,833,159 B1   11/2020  Hao et al.
2013/0082276 A1  4/2013  Park et al.
(Continued)

FOREIGN PATENT DOCUMENTS

CN      112786700 A     5/2021
EP        3651205 A1    5/2020

OTHER PUBLICATIONS

International Search Report and Written Opinion of the corresponding PCT application No. PCT/CN2021/116883 mailed on Jun. 7, 2022.

*Primary Examiner* — Peniel M Gumedzoe
(74) *Attorney, Agent, or Firm* — Li & Cai Intellectual Property (USA) Office (57) ABSTRACT

A nitride-based semiconductor device includes a first and a second nitride-based semiconductor layers, a doped III-V semiconductor layer, a gate, a source electrode, and a drain electrode. The doped III-V semiconductor layer is disposed over the second nitride-based semiconductor layer and has opposite first sidewalls which recessed inward toward a body of the doped III-V semiconductor layer between the sidewalls to make a curved profile located at a bottom of the doped III-V semiconductor layer. The gate electrode is disposed above the doped III-V semiconductor layer. The source electrode and the drain electrode are disposed above the second nitride-based semiconductor layer. The gate electrode is located between the source and drain electrodes.

20 Claims, 8 Drawing Sheets

(51) Int. Cl.
*H01L 29/10* (2006.01)
*H01L 29/20* (2006.01)
*H01L 29/423* (2006.01)
*H01L 29/66* (2006.01)
*H10D 30/01* (2025.01)
*H10D 30/47* (2025.01)
*H10D 62/10* (2025.01)
*H10D 62/17* (2025.01)
*H10D 62/85* (2025.01)
*H10D 64/27* (2025.01)

(52) U.S. Cl.
CPC ......... *H10D 62/117* (2025.01); *H10D 62/343* (2025.01); *H10D 62/8503* (2025.01); *H10D 64/411* (2025.01)

(56) References Cited

U.S. PATENT DOCUMENTS

| | | |
|---|---|---|
| 2015/0318387 A1 | 11/2015 | Chiu et al. |
| 2016/0240646 A1 | 8/2016 | Chiu et al. |
| 2019/0198654 A1 | 6/2019 | Lin et al. |
| 2020/0176595 A1* | 6/2020 | Otake .................. H10D 30/475 |
| 2023/0015042 A1* | 1/2023 | Yeh ........................ H10D 84/82 |

* cited by examiner

NITRIDE-BASED SEMICONDUCTOR DEVICE AND METHOD FOR MANUFACTURING THE SAME

FIELD OF THE INVENTION

The present invention generally relates to a nitride-based semiconductor device. More specifically, the present invention relates to a nitride-based semiconductor device having a doped III-V semiconductor layer with a curved profile.

BACKGROUND

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

SUMMARY OF THE INVENTION

In accordance with one aspect of the present disclosure, a nitride-based semiconductor device is provided. The nitride-based semiconductor device includes a first nitride-based semiconductor layer, a second nitride-based semiconductor layer, a doped III-V semiconductor layer, a gate electrode, a source electrode, and a drain electrode. The second nitride-based semiconductor layer is disposed on the first nitride-based semiconductor layer and has a bandgap greater than a bandgap of the first nitride-based semiconductor layer. The doped III-V semiconductor layer is disposed over the second nitride-based semiconductor layer and has opposite first sidewalls which recessed inward toward a body of the doped III-V semiconductor layer between the sidewalls to make a curved profile located at a bottom of the doped III-V semiconductor layer. The gate electrode is disposed above the doped III-V semiconductor layer. The source electrode and the drain electrode are disposed above the second nitride-based semiconductor layer. The gate electrode is located between the source and drain electrodes.

In accordance with one aspect of the present disclosure, a nitride-based semiconductor device is provided. The nitride-based semiconductor device includes a first nitride-based semiconductor layer, a second nitride-based semiconductor layer, a doped III-V semiconductor layer, a gate electrode, a source electrode, and a drain electrode. The second nitride-based semiconductor layer is disposed on the first nitride-based semiconductor layer and has a bandgap greater than a bandgap of the first nitride-based semiconductor layer. The doped III-V semiconductor layer is disposed over the second nitride-based semiconductor layer and has opposite recessed sidewalls such that the a doped III-V semiconductor layer has a profile from wide to narrow and then from narrow to wide along a vertical direction. The gate electrode is disposed above the doped III-V semiconductor layer. The source electrode and the drain electrode are disposed above the second nitride-based semiconductor layer. The gate electrode is located between the source and drain electrodes.

In accordance with one aspect of the present disclosure, a method for manufacturing a semiconductor device is provided. The method includes steps as follows. A first nitride-based semiconductor layer is formed on a substrate. A second nitride-based semiconductor layer is formed on the first nitride-based semiconductor layer. A blanket doped III-V semiconductor layer is formed on the second nitride-based semiconductor layer. A mask layer is formed on the blanket doped III-V semiconductor layer with portions of the blanket doped III-V semiconductor layer exposed from the mask layer. The exposed portions of the blanket doped III-V semiconductor layer are removed to form an intermediate doped III-V semiconductor layer having a protruding portion. A cap layer is formed to cover the protruding portion of the intermediate doped III-V semiconductor layer with portions of the intermediate doped III-V semiconductor layer exposed. The exposed portions of the intermediate doped III-V semiconductor layer are thermally decomposed to form an intermediate doped III-V semiconductor layer covered with the cover layer. The cap layer is removed from the intermediate doped III-V semiconductor layer.

By applying the above configuration, the profile of the doped III-V semiconductor layer under the gate electrode is designed to be a curved profile, and thus the length of the gate leakage current pathway can be increased. As such, the equivalent resistance of the afore-mentioned gate leakage current pathway can be increased, thereby decreasing the gate leakage current. Therefore, the semiconductor device of the present disclosure can have good electrical properties.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "on," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Figure 1A:
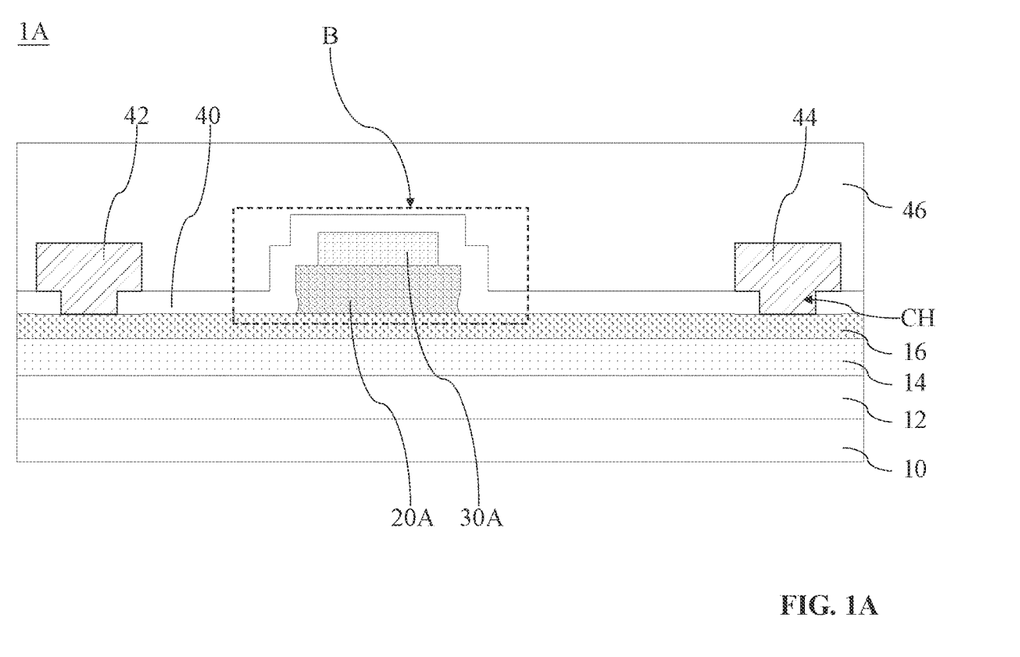
FIG. 1A is a vertical cross-sectional view of a semiconductor device according to some embodiments of the present disclosure.

FIG. 1A is a vertical cross-sectional view of a semiconductor device 1A according to some embodiments of the present disclosure. The semiconductor device 1A includes a substrate 10, a buffer layer 12, nitride-based semiconductor layers 14 and 16, a doped III-V semiconductor layer a gate electrode 30A, a passivation layer 40, electrodes 42 and 44, and a passivation layer 46.

The substrate 10 may be a semiconductor substrate. The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example, but is not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxial (epi) layer, or combinations thereof.

The buffer layer 12 can be disposed on/over/above the substrate 10. The buffer layer 12 can be disposed between the substrate 10 and the nitride-based semiconductor layer 14. The buffer layer 12 can be configured to reduce lattice and thermal mismatches between the substrate and the nitride-based semiconductor layer 14, thereby curing defects due to the mismatches/difference. The buffer layer 12 may include a III-V compound. The III-V compound can include, for example but are not limited to, aluminum, gallium, indium, nitrogen, or combinations thereof. Accordingly, the exemplary materials of the buffer layer 12 can further include, for example but are not limited to, GaN, AlN, AlGaN, InAlGaN, or combinations thereof.

In some embodiments, the semiconductor device 1A may further include a nucleation layer (not shown). The nucleation layer may be formed between the substrate 10 and the buffer layer 12. The nucleation layer can be configured to provide a transition to accommodate a mismatch/difference between the substrate 10 and a III-nitride layer of the buffer layer. The exemplary material of the nucleation layer can include, for example but is not limited to AlN or any of its alloys.

The nitride-based semiconductor layer 14 is disposed on/over/above the buffer layer 12. The nitride-based semiconductor layer 16 is disposed on/over/above the nitride-based semiconductor layer 14. The exemplary materials of the nitride-based semiconductor layer 14 can include, for example but are not limited to, nitrides or group III-V compounds, such as GaN, AlN, InN, $In_xAl_yGa_{(1-x-y)}N$ where x+y≤1, $Al_xGa_{(1-x)}N$ where x≤1. The exemplary materials of the nitride-based semiconductor layer 16 can include, for example but are not limited to, nitrides or group III-V compounds, such as GaN, AlN, InN, $In_xAl_yGa_{(1-x-y)}N$ where x+y≤1, $Al_yGa_{(1-y)}N$ where y≤1.

The exemplary materials of the nitride-based semiconductor layers 14 and 16 are selected such that the nitride-based semiconductor layer 16 has a bandgap (i.e., forbidden band width) greater than a bandgap of the nitride-based semiconductor layer 14, which causes electron affinities thereof different from each other and forms a heterojunction therebetween. For example, when the nitride-based semiconductor layer 14 is an undoped GaN layer having a bandgap of approximately 3.4 eV, the nitride-based semiconductor layer 16 can be selected as an AlGaN layer having bandgap of approximately 4.0 eV. As such, the nitride-based semiconductor layers 14 and 16 can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction. Accordingly, the semiconductor device 1A is available to include at least one GaN-based high-electron-mobility transistor (HEMT).

The doped III-V semiconductor layer 20A is disposed on/over/above the nitride-based semiconductor layer 16. The gate electrode 30A is disposed on/over/above the doped III-V semiconductor layer 20A. The gate electrode 30A is in contact with the doped III-V semiconductor layer 20A. The doped III-V semiconductor layer 20A is disposed/sandwiched between the nitride-based semiconductor layer 16 and the gate electrode 30A.

In the exemplary illustration of FIG. 1A, the semiconductor device 1A is an enhancement mode device, which is in a normally-off state when the gate electrode 30A is at approximately zero bias. Specifically, the doped III-V semiconductor layer 20A may create at least one p-n junction with the nitride-based semiconductor layer 14 to deplete the 2DEG region, such that zone of the 2DEG region corresponding to position below the corresponding the gate electrode 30A have different characteristics (e.g., different electron concentrations) than the remaining of the 2DEG region and thus is blocked.

Due to this mechanism, the semiconductor device 1A has a normally-off characteristic. In other words, when no voltage is applied to the gate electrode 30A or a voltage applied to the gate electrode 30A is less than a threshold voltage (i.e., a minimum voltage required to form an inversion layer below the gate electrode 30A), the zone of the 2DEG region below the gate electrode 30A is kept blocked, and thus no current flows therethrough.

The gate electrode 30A can serve as a gate for a GaN-based HEMT of the semiconductor device 1A. During an operation of a gate, when a positive bias voltage is applied to the gate, a relatively high electrical field may be generated at the edge of the gate, so as to form a leakage current. The leakage current may flow along a pathway including edges of the gate and an underlying III-V semiconductor layer to a barrier layer. The leakage current issue may result from surface states located on the sidewalls/surfaces of the doped III-V semiconductor layer 20A. To overcome such the event, the doped III-V semiconductor layer 20A can be formed to have recessed sidewalls, which can significantly elongate the potential leakage current path. As such, the equivalent resistance of the pathway can increase such that the leakage current is decreased or suppressed.

Figure 1B:
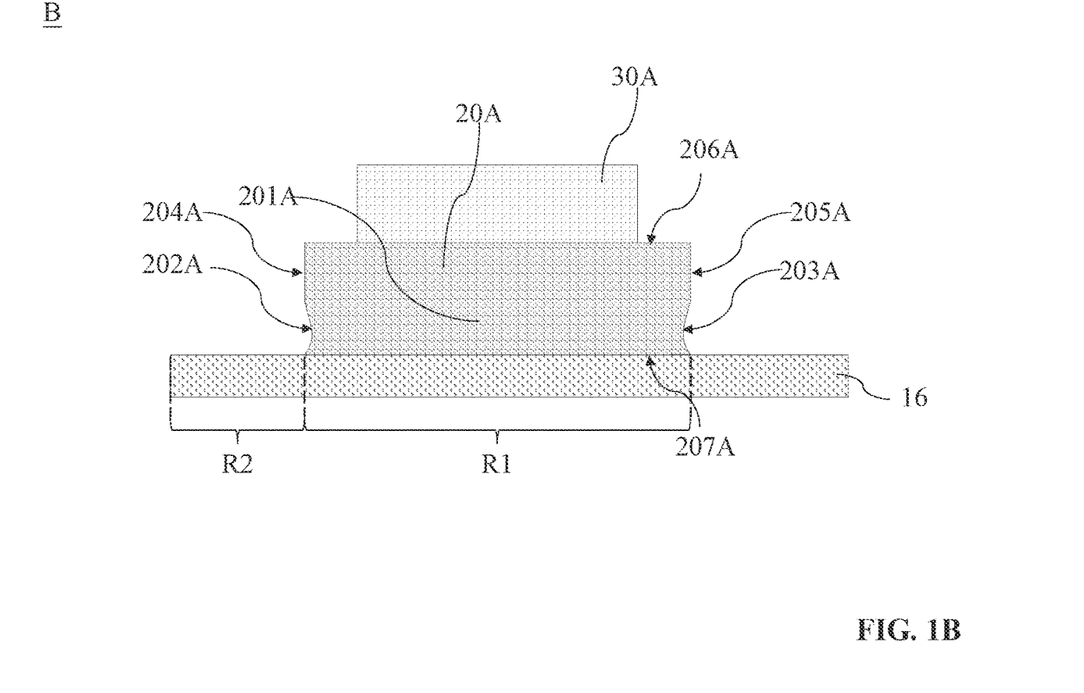
FIG. 1B is an enlarged vertical cross-sectional view of a region B in FIG. 1A.

Referring to FIG. 1A and FIG. 1B, in which FIG. 1B is an enlarged vertical cross-sectional view of a region B in the FIG. 1A. Specifically, the doped III-V semiconductor layer 20A has a body 201A and sidewalls 202A, 203A, 204A, and 205A. Further, the doped III-V semiconductor layer 20A has a top surface 206A and a bottom surface 207A which are opposites horizontal surfaces with respect to the nitride-based semiconductor layer 16.

The body 201A is located between the sidewalls 202A and 203A. The sidewall 202A is opposite to the sidewall 203A. The sidewalls 202A and 203A face the electrodes 42 and 44, respectively. The sidewalls 202A and 203A are connected to the nitride-based semiconductor layer 16. The bottom surface 207A of the doped III-V semiconductor layer 20A horizontally connects the sidewalls 202A and 203A.

The sidewalls 202A and 203A are recessed inward toward a body 201A of the doped III-V semiconductor layer 20A between the sidewalls 202A and 203A, so as to make a curved profile located at a bottom of the doped III-V semiconductor layer 20A. Along a vertical direction, the curved profile constituted by the recessed sidewalls 202A and 203A is from wide to narrow and then from narrow to wide.

The body 201A is located between the sidewalls 204A and 205A. The sidewall 204A is opposite to the sidewall 205A, and the sidewalls 204A and 205A face the electrodes 42 and 44, respectively. The sidewall 204A is located on the sidewall 202A, and the sidewall 205A is located on the sidewall 203A. The top surface 206A of the doped III-V semiconductor layer 20A horizontally connects the sidewalls 204A and 205A.

The sidewall 202A connects to the sidewall 204A and the bottom surface 207A of the doped III-V semiconductor layer 20A. The sidewall 203A connects to the sidewall 205A and the bottom surface 207A of the doped III-V semiconductor layer 20A. The sidewall 204A connects to the sidewall 202A and the top surface 206A of the doped III-V semiconductor layer 20A. The sidewall 205A connects to the sidewall 203A and the top surface 206A of the doped III-V semiconductor layer 20A.

The sidewalls 202A and 203A are more curved than the sidewalls 204A and 205A. The sidewalls 204A and 205A are substantially straight sidewalls. In some embodiments, both of the sidewalls 204A and 205A form a rectilinear profile located at the top of the doped III-V semiconductor layer 20A (or the curved profile). As such, a distance between the sidewalls 202A and 203A is less than a distance between the sidewalls 204A and 205A. The shortest distance between the sidewalls 202A and 203A is less than a width of the bottom surface 207A of the doped III-V semiconductor layer 20A.

Accordingly, the potential leakage current pathway can be elongated by the recessed sidewalls 202A and 203A, thereby increasing the equivalent resistance of the pathway. As compared to a doped III-V semiconductor layer with fully straight sidewalls, the leakage current at the edges of the doped III-V semiconductor layer 20A is decreased or suppressed.

One of the reasons for keeping the sidewalls 204A and 205A straight is the consideration of the yield rate. Specifically, for the purpose of protection or electrical isolation, a dielectric layer can be formed to cover a gate and an underlying semiconductor layer. Once the underlying semiconductor layer has a wide-area recess at edges, incompletely filling into the recess by dielectric material may occur, having the yield rate decreased.

Another one reason is related to the optionally selected process for forming the profile of the recessed sidewalls 202A and 203A. In some embodiment, the optionally selected process includes a thermal treatment process. By using the thermal treatment process, in addition to the achievement of the profile of the recessed sidewalls 202A and 203A, it can avoid introduction of surface states (or traps) to surfaces of the doped III-V semiconductor layer 20A.

In this regard, for an element which is formed as a layer, one of the steps in the formation is to apply an etching process to a blanket layer for determining location and dimension, which is called a patterning process. However, the applying of the etching process would introduce surface states to a side surface of the formed layer. The surface states may lead a leakage current and thus confine the performance of the semiconductor device. Accordingly, at least for the purpose of alleviating the negative impacts as afore-mentioned, the thermal treatment process can be optionally selected to modify the morphology of the doped III-V semiconductor layer 20A directly under the gate electrode 30A.

During the thermal treatment process, excess portions of the doped III-V semiconductor layer 20A are removed due to thermal decomposition. The thermal treatment process is selected so element layers other than the doped III-V semiconductor layer 20A can be avoid damage. For example, the thermal decomposition rate of the nitride-based semiconductor layer 16 is smaller than that of the doped III-V semiconductor layer 20A, so it can avoid greatly affecting the nitride-based semiconductor layer 16 during the thermal treatment process.

In some embodiments, the surface roughness of the nitride-based semiconductor layer 16 may change due to the thermal treatment process. The nitride-based semiconductor layer 16 has regions R1 and R2. The region R1 is in contact with the doped III-V semiconductor layer 20A. The region R2 is free from coverage of the doped III-V semiconductor layer 20A. During the thermal treatment process, the region R1 of the nitride-based semiconductor layer 16 is barely affected due to the protection of the doped III-V semiconductor layer 20A. During the thermal treatment process, a very small proportion of the region R2 of the nitride-based semiconductor layer 16 would be thermally decomposed. As such, the regions R1 and R2 can have different surface roughnesses. Specifically, the surface roughness of the region R2 can be greater than that of the region R1. Such the different can serve as evidence that the thermal treatment process is applied to the structure.

The doped III-V semiconductor layer 20A can be p-type doped III-V semiconductor layer. The exemplary materials of the doped III-V semiconductor layer 20A can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Zn, Cd, and Mg. In some embodiments, the nitride-based semiconductor layer 14 includes undoped GaN and the nitride-based semiconductor layer 16 includes AlGaN, and the doped III-V semiconductor layer 20A is a p-type GaN layer which can bend the underlying band structure upwards and deplete the corresponding zone of the 2DEG region, so as to place the semiconductor device 1A into an off-state condition.

The exemplary materials of the gate electrode 30A may include metals or metal compounds. The gate electrode 30A may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds.

Referring to FIG. 1A again, the passivation layer 40 can be disposed on/over/above the nitride-based semiconductor layer 16, the doped III-V semiconductor layer 20A, and the gate electrode 30A. The passivation layer 40 can be conformal with the doped III-V semiconductor layer 20A and the gate electrode 30A, so as to form a protruding portion above the nitride-based semiconductor layer 16. The passivation layer 40 includes contact holes CH. The protruding portions of the passivation layer can cover the doped III-V semiconductor layer 20A and the gate electrode 30A. The material of the passivation layer 40 can include, for example but is not limited to, dielectric materials. For example, the passivation layer 40 can include $SiN_x$ (e.g., $Si_3N_4$), $SiO_x$, $Si_3N_4$, SiON, SiC, SiBN, SiCBN, oxides, nitrides, oxides, nitrides, plasma-enhanced oxide (PEOX), tetraethoxysilane normal abbreviation (TEOS), or combinations thereof.

In some embodiments, the electrode 42 can serve as a source electrode. In some embodiments, the electrode 42 can serve as a drain electrode. In some embodiments, the electrode 44 can serve as a source electrode. In some embodiments, the electrode 44 can serve as a drain electrode. The role of the electrodes 42 and 44 depends on the device design.

The electrodes 42 and 44 are disposed on/over/above the nitride-based semiconductor layer 16. The electrodes 42 and 44 are in contact with the nitride-based semiconductor layer 16. The electrodes 42 and 44 are in contact with the nitride-based semiconductor layer 16. The electrodes 42 and 44 can extend through the contact holes CH of the passivation layer 40 to make contact with the nitride-based semiconductor layer 16. Each of the electrodes 42 and 44 can penetrate the passivation layer 40 through the contact hole CH to make a contact with the nitride-based semiconductor layer 16.

The gate electrode 30A is located between the electrodes 42 and 44. The electrode 42 is closer to the gate electrode 30A and the doped III-V semiconductor layer 20A than the electrode 44. That is, the electrodes 42 and 44 can be arranged as being asymmetrical about the gate electrode 30A and the doped III-V semiconductor layer 20A. In some embodiments, the electrodes 42 and 44 can be arranged as being symmetrical about the gate electrode 30A and the doped III-V semiconductor layer 20A. The arrangement depends on different electrical property requirements.

In some embodiments, the electrodes 42 and 44 can include, for example but are not limited to, metals, alloys, doped semiconductor materials (such as doped crystalline silicon), compounds such as silicides and nitrides, other conductor materials, or combinations thereof. The exemplary materials of the electrodes 42 and 44 can include, for example but are not limited to, Ti, AlSi, TiN, or combinations thereof. The electrodes 42 and 44 may be a single layer, or plural layers of the same or different composition. In some embodiments, the electrodes 42 and 44 form ohmic contacts with the nitride-based semiconductor layer 16. The ohmic contacts can be achieved by applying Ti, Al, or other suitable materials to the electrodes 42 and 44. In some embodiments, each of the electrodes 42 and 44 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The passivation layer 46 can be disposed on/over/above electrodes 42 and 44, the nitride-based semiconductor layer 16, and the passivation layer 40. The passivation layer 46 fills into the recessed sidewalls 202A and 203A of the doped III-V semiconductor layer 20A. The material of the passivation layer 46 can include, for example but is not limited to, dielectric materials. The passivation layer 46 can serve as a planarization layer which has a level top surface to support other layers/elements. In some embodiments, the passivation layer 46 can be formed as being thicker, and a planarization process, such as a chemical mechanical polish (CMP) process, is performed on the passivation layer 46 to remove the excess portions, thereby forming a level top surface. The exemplary materials of the passivation layer 46 can be identical to or similar to that of the passivation layer 40.

Different stages of a method for manufacturing the semiconductor device 1A are shown in FIG. 2A, FIG. 2B, FIG. 2C, FIG. 2D, and FIG. 2E, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 2A:
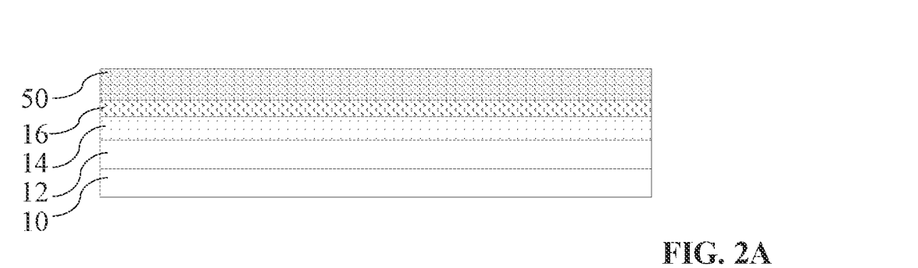
FIG. 2A, FIG. 2B, FIG. 2C, FIG. 2D, and FIG. 2E show different stages of a method for manufacturing a nitride-based semiconductor device according to some embodiments of the present disclosure.

Referring to FIG. 2A, a buffer layer 12 can be formed on/over/above the substrate 10 by using the above-mentioned deposition techniques. A nitride-based semiconductor layer 14 can be formed on/over/above the buffer layer 12 by using the above-mentioned deposition techniques. A nitride-based semiconductor layer 16 can be formed on/over/above the nitride-based semiconductor layer 14 by using the above-mentioned deposition techniques. A blanket doped nitride-based semiconductor layer 50 is formed on/over/above the nitride-based semiconductor layer 16.

Figure 2B:
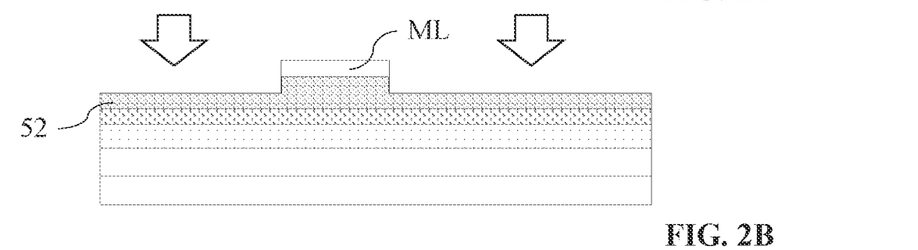

Referring to FIG. 2B, a mask layer ML is formed on the blanket doped III-V semiconductor layer 50 with portions of the blanket doped III-V semiconductor layer 50 exposed from the mask layer ML. A dry etching process is performed on the blanket doped nitride-based semiconductor layer 50. Therefore, at least a portion of the exposed portions of the blanket doped III-V semiconductor layer 50 is removed, and thus the blanket doped III-V semiconductor layer 50 is thinned to form an intermediate doped III-V semiconductor layer 52 having a protruding portion. In some embodiments, a stop layer is used for thinning the blanket doped III-V semiconductor layer 50 and then is removed after the dry etching process. In some embodiments, the stop layer can be positioned in the blanket doped III-V semiconductor layer 50 to define a desired thickness of the intermediate doped III-V semiconductor layer 52.

Figure 2C:
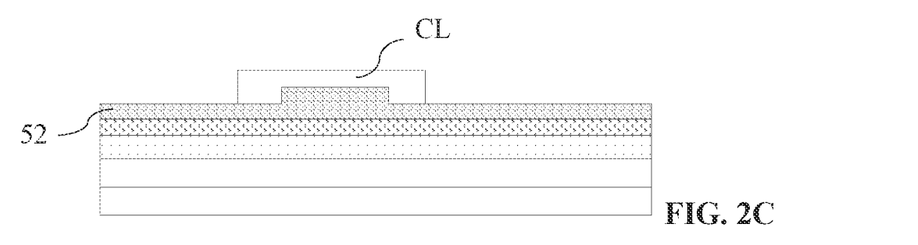

Referring to FIG. 2C, the mask layer ML is removed. A cap layer CL is formed to cover the protruding portion of the intermediate doped III-V semiconductor layer 52 with portions of the intermediate doped III-V semiconductor layer 52 exposed from the cap layer CL. The cap layer CL can act as a protect/cover layer with respect to the protruding portion of the intermediate doped III-V semiconductor layer 52. The exemplary materials of the cap layer CL can include for example but are not limited to $SiO_2$, SiN, or combinations thereof.

Figure 2D:
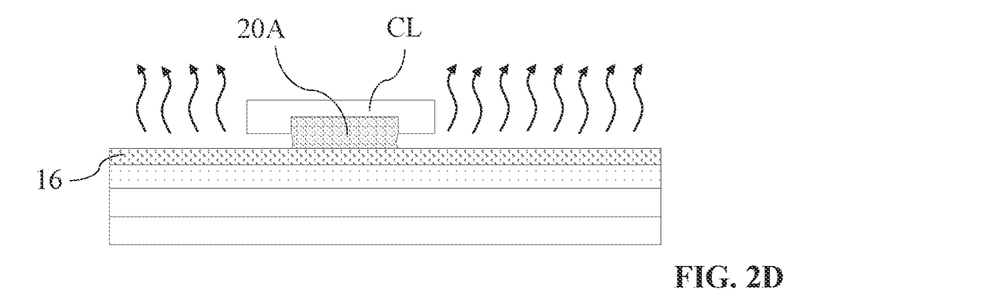

Referring to FIG. 2D, a thermal treatment process is performed on the resultant structure in FIG. 2C. Therefore, the exposed portions of the intermediate doped III-V semiconductor layer 52 can be thermally decomposed to form a doped III-V semiconductor layer 20A covered with the cap layer CL.

The stage of the FIG. 2D is to define morphology of the doped III-V semiconductor layer 20A with keeping other element layers away from damage, resulting from optional selection to a temperature range. Accordingly, the temperature range of the thermal treatment process is selected according to the material properties in the structure.

For example, the material of the intermediate doped III-V semiconductor layer 52 can be selected as p-type GaN, the material of the nitride-based semiconductor layer 16 can be selected as AlGaN, and the material of the cap layer CL can be selected as $SiO_2$. In some embodiments, the temperature range of the thermal treatment process can be selected in a range from about 900° C. to about 1100° C. based on the material characteristics.

In such a heating temperature range, the thermal decomposition rate of the p-GaN layer is much greater than that of AlGaN layer, so that the thermal decomposition affection to the AlGaN layer can be negligible. Due to the protection provided by the cap layer CL, a portion of the intermediate doped III-V semiconductor layer 52 covered/protected by the cap layer CL is hard to be thermally decomposed, and a bottom portion beneath edges of the cap layer CL is horizontally decomposed during its thermally decomposing.

As such, after the heating process, the excess portion of the p-GaN layer would be thermally decomposed into gallium (Ga) and nitrogen. The nitride-based semiconductor layer 16 (e.g., barrier layer) is hard to be thermally decomposed/damaged. It should be noted that the residue gallium can be easily removed by the clean solution and the quality of the nitride-based semiconductor layer 16 can remain after the heating process.

For a process used for determining a profile of a III-V semiconductor layer, an etching process may be applied to, including a reactive ion etching (RIE) process, an electron cyclotron resonance plasma (ECR) process, or an inductively coupled plasma (ICP) process. However, the dry etching process would introduce additional damages on the target layer (e.g., the nitride-based semiconductor layer 16). The adoption of the dry etching process would introduce additional elements on the surface of the target layer and thus deteriorate the electrical properties and reliability of the device, such as introduction of boron ion ($B^+$), fluorine ion ($F^-$), or chloride ions ($Cl^-$), which may deteriorate the electrical properties and reliability of the device.

In contrast, the manufacturing method of the semiconductor device 1A applies thermal decomposing process to eventually determine the profile of the doped III-V semiconductor layer 20A instead of dry etching process. Such the process would make the nitride-based semiconductor layer 16 exempt from being damaged and contaminated by the additional elements, and the quality of the nitride-based semiconductor layer 16 can be maintained/kept.

Figure 2E:
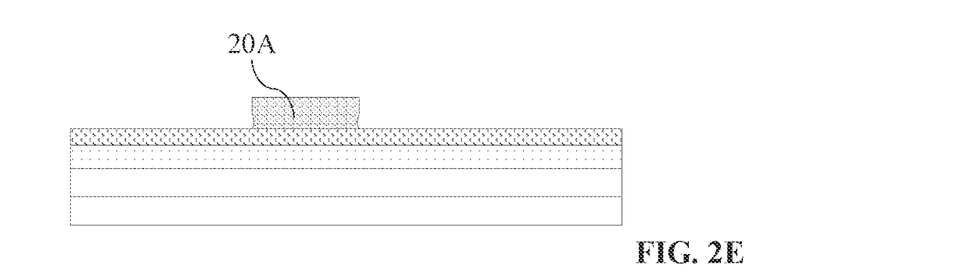

Referring to FIG. 2E, the cap layer CL is removed from the doped III-V semiconductor layer 20A. Thereafter, a gate electrode 30A, a passivation layer 40, electrodes 42 and 44, and a passivation layer 46 can be formed, obtaining the configuration of the semiconductor device 1A as shown in FIG. 1A.

Figure 3:
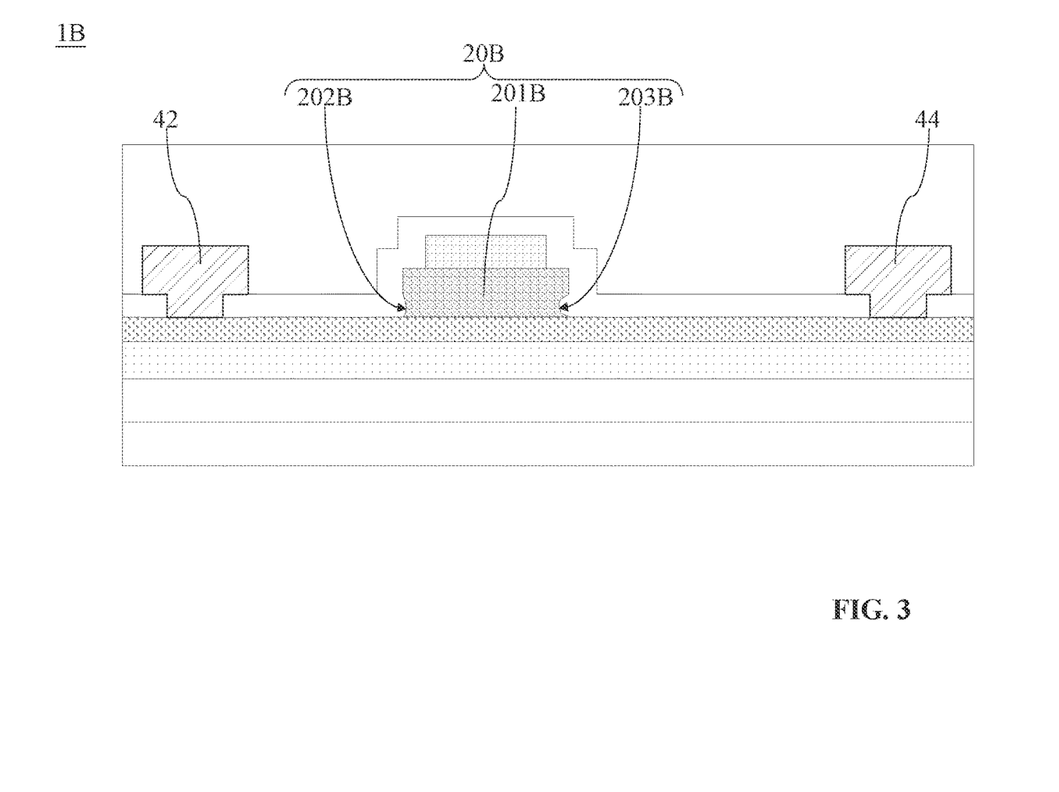
FIG. 3 is a vertical cross-sectional view of a semiconductor device according to some embodiments of the present disclosure.

FIG. 3 is a vertical cross-sectional view of a semiconductor device 1B according to some embodiments of the present disclosure. The semiconductor device 1B is similar to the semiconductor device 1A as described and illustrated with reference to FIG. 1A and FIG. 1B, except that the doped III-V semiconductor layer 20A of the semiconductor device 1A is replaced by a doped III-V semiconductor layer 20B. In the present embodiment, as shown in the exemplary illustration of FIG. 3, sidewalls 202B and 203B are asymmetrical about a body 201B of the doped III-V semiconductor layer 20B. The sidewalls 202B and 203B have different recessed depths. The recessed depth of the sidewall 203B is greater than the recessed depth of the sidewall 202B. As such, the leakage current pathway along the sidewall 203B is further elongated. Such difference corresponds with the operation that a high voltage is applied to the electrode 44 during working. The occurrence of the leakage current at the sidewall 203A may be stronger than the leakage current at the sidewall 204A, so the sidewall 204A can have a deeper recess to ease the leakage current issue.

Figure 4:
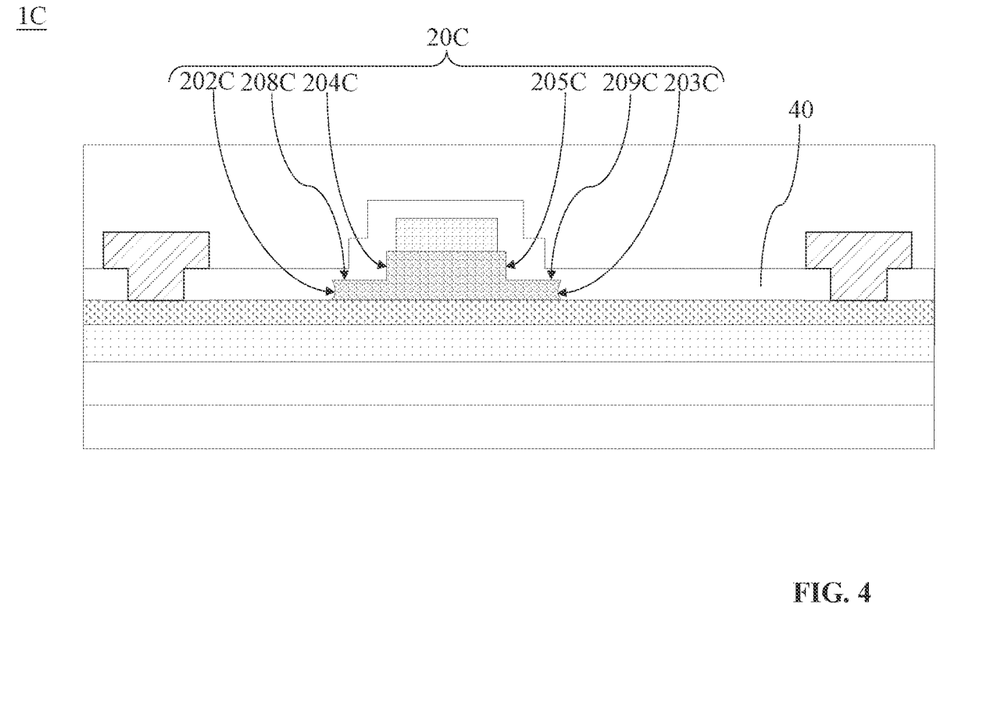
FIG. 4 is a vertical cross-sectional view of a semiconductor device according to some embodiments of the present disclosure.

FIG. 4 is a vertical cross-sectional view of a semiconductor device 1C according to some embodiments of the present disclosure. The semiconductor device 1B is similar to the semiconductor device 1A as described and illustrated with reference to FIG. 1A and FIG. 1B, except that the doped III-V semiconductor layer 20A of the semiconductor device 1A is replaced by a doped III-V semiconductor layer 20C. In the present embodiment, as shown in the exemplary illustration of FIG. 4, the doped III-V semiconductor layer 20A further has opposite horizontal surfaces 208C and 209C. The horizontal surface 208C is located between the sidewalls 202C and 204C. The horizontal surface 208C connects the sidewalls 202C and 204C. The horizontal surface 209C is located between the sidewalls 203C and 205C. The horizontal surface 209C connects the sidewalls 203C and 205C.

With the horizontal surfaces 208C and 209C, the doped III-V semiconductor layer 20C can be formed to have a stepwise profile. The stepwise profile can adapt the formation of the passivation layer 40. Specifically, during the deposition of the passivation layer 40, at least one corner of the stepwise profile of the doped III-V semiconductor layer 20C can further bear the stress from the passivation layer 40, so as to avoid deformation of the passivation layer 40.

To obtain the semiconductor device 1C, in the manufacturing process, the thermal treatment process can be terminated earlier than FIG. 2D. For example, as shown in FIG. 2D, prior to the bottom portion of the doped III-V semiconductor layer 20A beneath the edges of the cap layer CL is horizontally decomposed, the thermal treatment process can be terminated.

Figure 5:
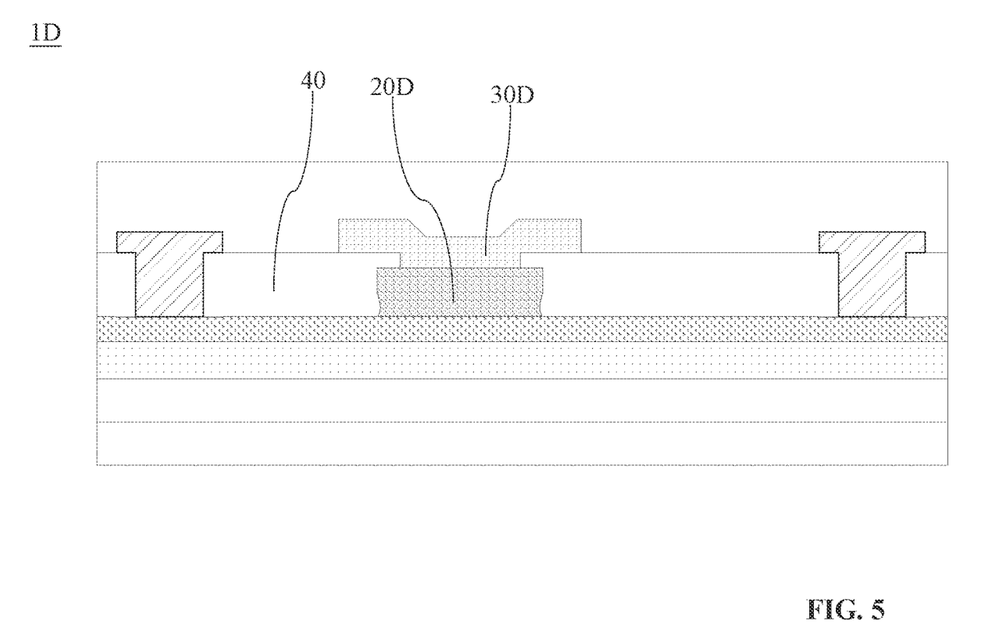
FIG. 5 is a vertical cross-sectional view of a semiconductor device according to some embodiments of the present disclosure.

FIG. 5 is a vertical cross-sectional view of a semiconductor device 100D according to some embodiments of the present disclosure. The semiconductor device 1D is similar to the semiconductor device 1A as described and illustrated with reference to FIG. 1A and FIG. 1B, except that the gate electrode 30A of the semiconductor device 1A is replaced by the gate electrode 30D. In the present embodiment, as shown in the exemplary illustration of FIG. 5, at least a portion of the gate electrode 30D is located on/over/above the passivation layer 40. At least a portion of the gate electrode 30D covers a top surface of the passivation layer 40. At least a portion of the gate electrode 30D extends along an inner side surface of the passivation layer 40 to make contact with the doped III-V semiconductor layer 20D. In the manufacturing process, the formation of the passivation layer 40 is brought to the stage prior to the formation of the gate electrode 30D. Accordingly, a gate access can be defined by forming an opening in the passivation layer 40 prior to the formation of the gate electrode 30A, which can adapt the different process requirements.

Figure 6:
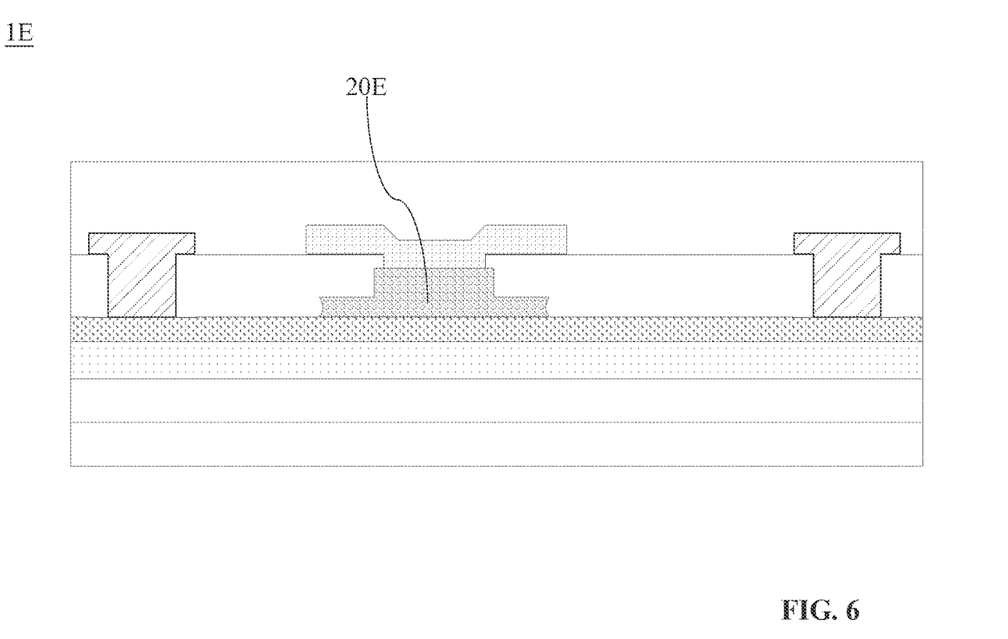
FIG. 6 is a vertical cross-sectional view of a semiconductor device according to some embodiments of the present disclosure.

FIG. 6 is a vertical cross-sectional view of a semiconductor device 1E according to some embodiments of the present disclosure. The semiconductor device 1E is similar to the semiconductor device 1D as described and illustrated with reference to FIG. 5, except that the doped III-V semiconductor layer 20D in FIG. 5 is replaced by a doped III-V semiconductor layer 20E. In the present embodiment, as shown in the exemplary illustration of FIG. 6, the doped III-V semiconductor layer 20E can apply the configuration the same as the doped III-V semiconductor layer in FIG. 4.

In the semiconductor devices 1B, 1C, 1D and 1E, the curved profile of the doped III-V semiconductor layer can be compatible with different device structures/designs.

Based on the above description, in the present embodiments of the disclosure, the doped III-V semiconductor layer under the gate electrode has a profile from wide to narrow and then from narrow to wide along a vertical direction, and thus the length of the gate leakage current pathway can be increased. As such, the equivalent resistance of the aforementioned pathway can be increased, thereby decreasing the gate leakage current. Therefore, the semiconductor device of the present disclosure can have good electrical properties.

Moreover, by heating the doped III-V semiconductor layer in an appropriate heating temperature, the final curved profile of the doped III-V semiconductor layer can be achieved by during its thermal decomposing instead of applying dry etching process. Therefore, the foreign element contaminant and the excess damage can be avoided, and thus the doped III-V semiconductor layer can have a good quality.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device, comprising:
a first nitride-based semiconductor layer;
a second nitride-based semiconductor layer disposed on the first nitride-based semiconductor layer and having a bandgap greater than a bandgap of the first nitride-based semiconductor layer;
a doped III-V semiconductor layer disposed over the second nitride-based semiconductor layer and having opposite first sidewalls which recessed inward toward a body of the doped III-V semiconductor layer between the first sidewalls to make a curved profile located at a bottom of the doped III-V semiconductor layer;
a gate electrode disposed above the doped III-V semiconductor layer; and
a source electrode and a drain electrode disposed above the second nitride-based semiconductor layer, wherein the gate electrode is located between the source and drain electrodes.

2. The nitride-based semiconductor device of claim 1, wherein the doped III-V semiconductor layer has a rectilinear profile on the curved profile.

3. The nitride-based semiconductor device of claim 1, wherein the recessed first sidewalls of the doped III-V semiconductor layer are connected to the second nitride-based semiconductor layer.

4. The nitride-based semiconductor device of claim 3, wherein the doped III-V semiconductor layer further has opposite second sidewalls located on and connected to the first sidewalls, respectively, and a distance between the first sidewalls is less than a distance between the second sidewalls.

5. The nitride-based semiconductor device of claim 4, wherein the first sidewalls are more curved than the second sidewalls.

6. The nitride-based semiconductor device of claim 3, wherein the doped III-V semiconductor layer further has opposite second sidewalls located over the first sidewalls, respectively, and a distance between the first sidewalls is greater than a distance between the second sidewalls.

7. The nitride-based semiconductor device of claim 6, wherein the doped III-V semiconductor layer further has opposite horizontal surfaces connecting the first sidewalls to the second sidewalls.

8. The nitride-based semiconductor device of claim 1, wherein the shortest distance between the first sidewalls is less than a width of a bottom surface of the doped III-V semiconductor layer.

9. The nitride-based semiconductor device of claim 1, wherein the second nitride-based semiconductor layer has a first region in contact with the doped III-V semiconductor layer and a second region free from coverage of the doped III-V semiconductor layer, and the first and second regions have different surface roughness.

10. The nitride-based semiconductor device of claim 1, wherein the first sidewalls have different recessed depths.

11. The nitride-based semiconductor device of claim 1, further comprising a passivation layer disposed above the second nitride-based semiconductor layer and filling into the recessed first sidewalls.

12. The nitride-based semiconductor device of claim 11, wherein the gate electrode is located over the passivation layer.

13. The nitride-based semiconductor device of claim 1, wherein the gate electrode extends along a side surface of the passivation layer to make contact with the doped III-V semiconductor layer.

14. The nitride-based semiconductor device of claim 1, wherein the first sidewalls are asymmetrical about the body of the doped III-V semiconductor layer.

15. The nitride-based semiconductor device of claim 1, wherein the source electrode is closer to the doped III-V semiconductor layer than the drain electrode.

16. A method for manufacturing a semiconductor device, comprising:
    forming a first nitride-based semiconductor layer on a substrate;
    forming a second nitride-based semiconductor layer on the first nitride-based semiconductor layer;
    forming a blanket doped III-V semiconductor layer on the second nitride-based semiconductor layer;
    forming a mask layer on the blanket doped III-V semiconductor layer with portions of the blanket doped III-V semiconductor layer exposed from the mask layer;
    removing the exposed portions of the blanket doped III-V semiconductor layer to form an intermediate doped III-V semiconductor layer having a protruding portion;
    forming a cap layer to cover the protruding portion of the intermediate doped III-V semiconductor layer with portions of the intermediate doped III-V semiconductor layer exposed;
    thermally decomposing the exposed portions of the intermediate doped III-V semiconductor layer to form an intermediate doped III-V semiconductor layer covered with the cap layer; and
    removing the cap layer from the intermediate doped III-V semiconductor layer.

17. The method of claim 16, wherein removing the exposed portions of the blanket doped III-V semiconductor layer is performed such that the blanket doped III-V semiconductor layer is thinned.

18. The method of claim 16, wherein thermally decomposing is performed in a temperature range from 900° C. to 1100° C.

19. The method of claim 16, wherein the intermediate doped III-V semiconductor layer has a portion beneath the cap layer which is horizontally decomposed during thermally decomposing.

20. The method of claim 16, wherein removing the exposed portions of the blanket doped III-V semiconductor layer is performed by using a dry etching process.

* * * * *